United States Patent [19]
Gasworth

[11] Patent Number: 5,516,554
[45] Date of Patent: *May 14, 1996

[54] CYCLIC HOT-FILAMENT CVD OF DIAMOND

[75] Inventor: Steven M. Gasworth, Scotia, N.Y.

[73] Assignee: General Electric Company, Worthington, Ohio

[*] Notice: The term of this patent shall not extend beyond the expiration date of Pat. No. 5,108,779.

[21] Appl. No.: 150,633

[22] Filed: Nov. 10, 1993

Related U.S. Application Data

[62] Division of Ser. No. 332,914, Apr. 4, 1989, Pat. No. 5,261,959, which is a continuation of Ser. No. 198,966, May 26, 1988, abandoned.

[51] Int. Cl.[6] .................................................. C23C 16/26
[52] U.S. Cl. .................. 427/249; 427/577; 427/255.1; 427/255.5; 427/122; 423/446
[58] Field of Search ........................ 427/247, 577, 427/372.2, 255.5, 122, 255.1; 423/446

[56] References Cited

U.S. PATENT DOCUMENTS

| | | |
|---|---|---|
| 3,030,188 | 4/1962 | Eversole . |
| 3,652,444 | 2/1972 | Lester et al. . |
| 4,058,430 | 11/1977 | Suntola et al. . |
| 4,434,188 | 2/1984 | Kamo et al. . |
| 4,664,743 | 5/1987 | Moss et al. . |
| 4,707,384 | 11/1987 | Schachner et al. . |
| 4,806,321 | 2/1989 | Nishizawa et al. . |
| 4,830,702 | 5/1989 | Singh et al. ......................... 427/577 |
| 4,839,195 | 6/1989 | Kitamura et al. ................... 427/377 |
| 4,986,214 | 1/1991 | Zumoto et al. . |
| 5,108,779 | 4/1992 | Gasworth ............................ 427/249 |

FOREIGN PATENT DOCUMENTS 60-60714  4/1985  Japan .

Primary Examiner—Roy V. King

[57] ABSTRACT

The steady state operating parameters of a low pressure cyclic hot-filament chemical vapor deposition process for making diamond, i.e., nucleation-growth and graphite removal, are applied as controlled sequential steps to favor nucleation and growth.

8 Claims, 3 Drawing Sheets

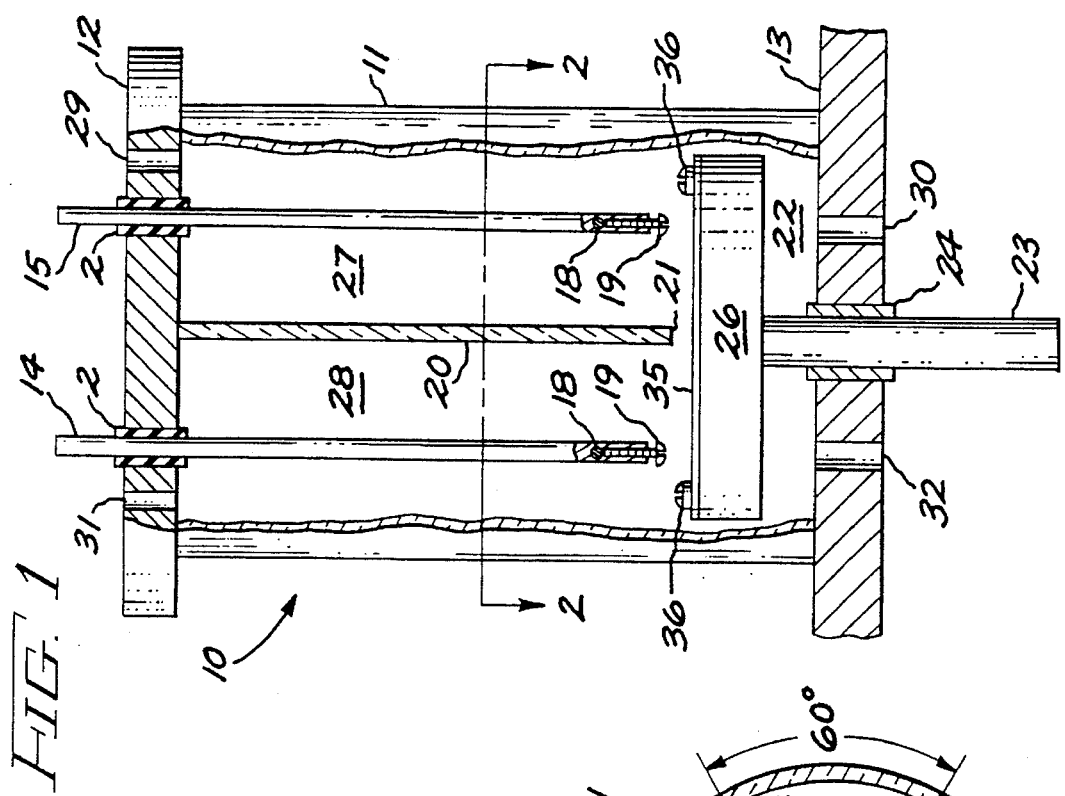
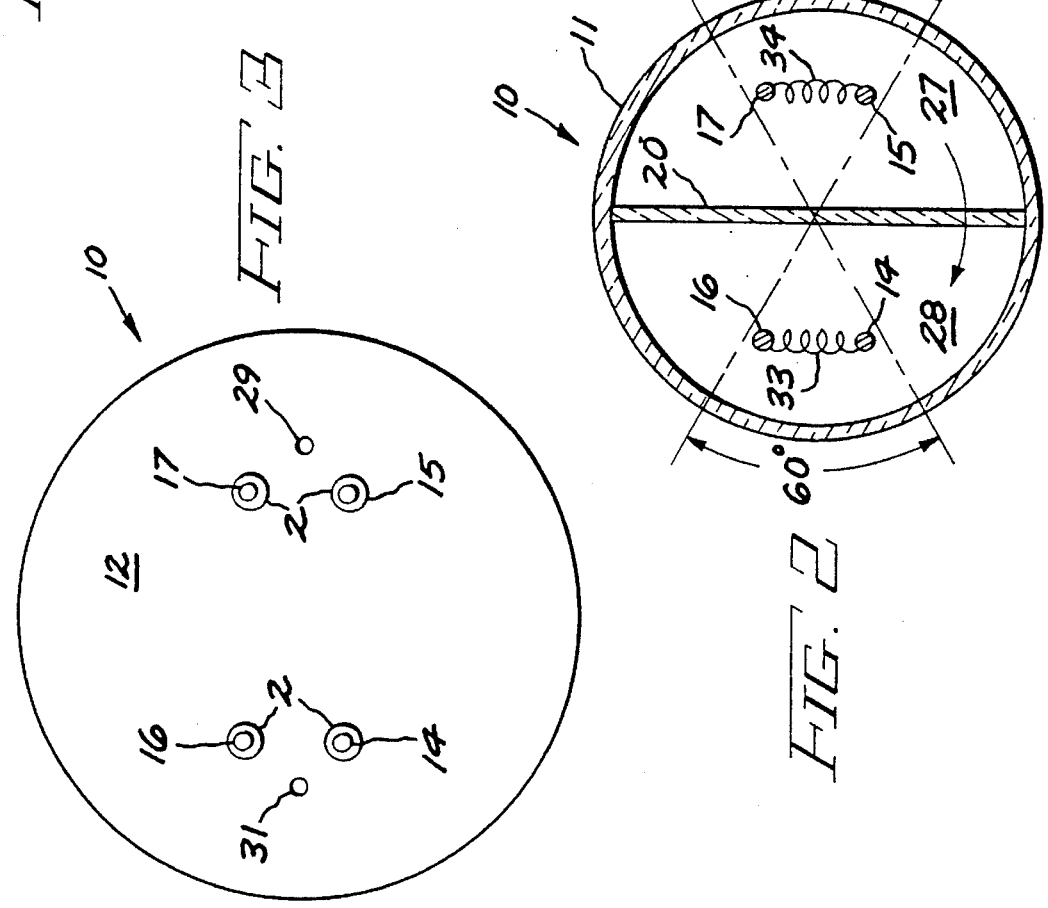

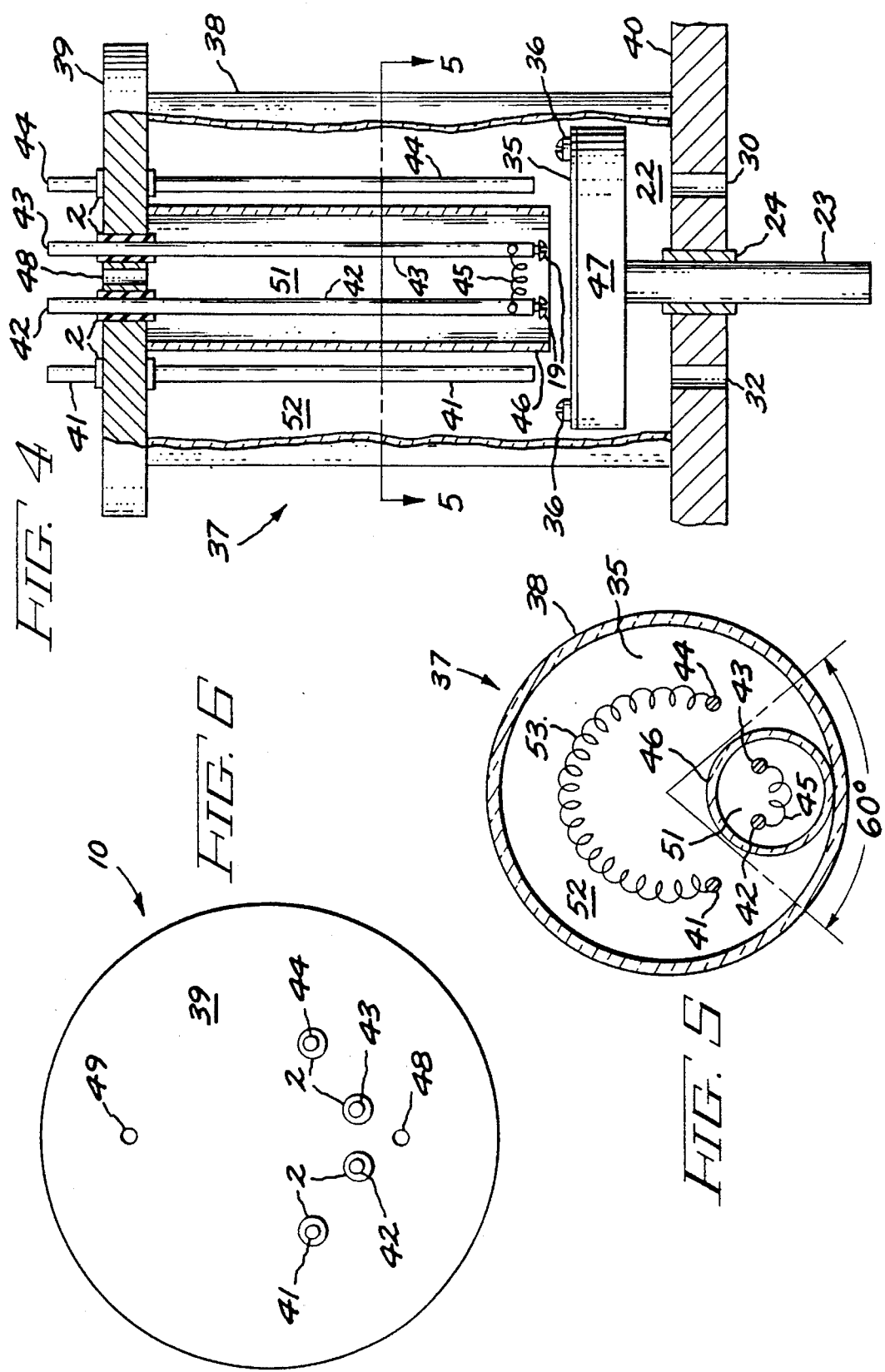

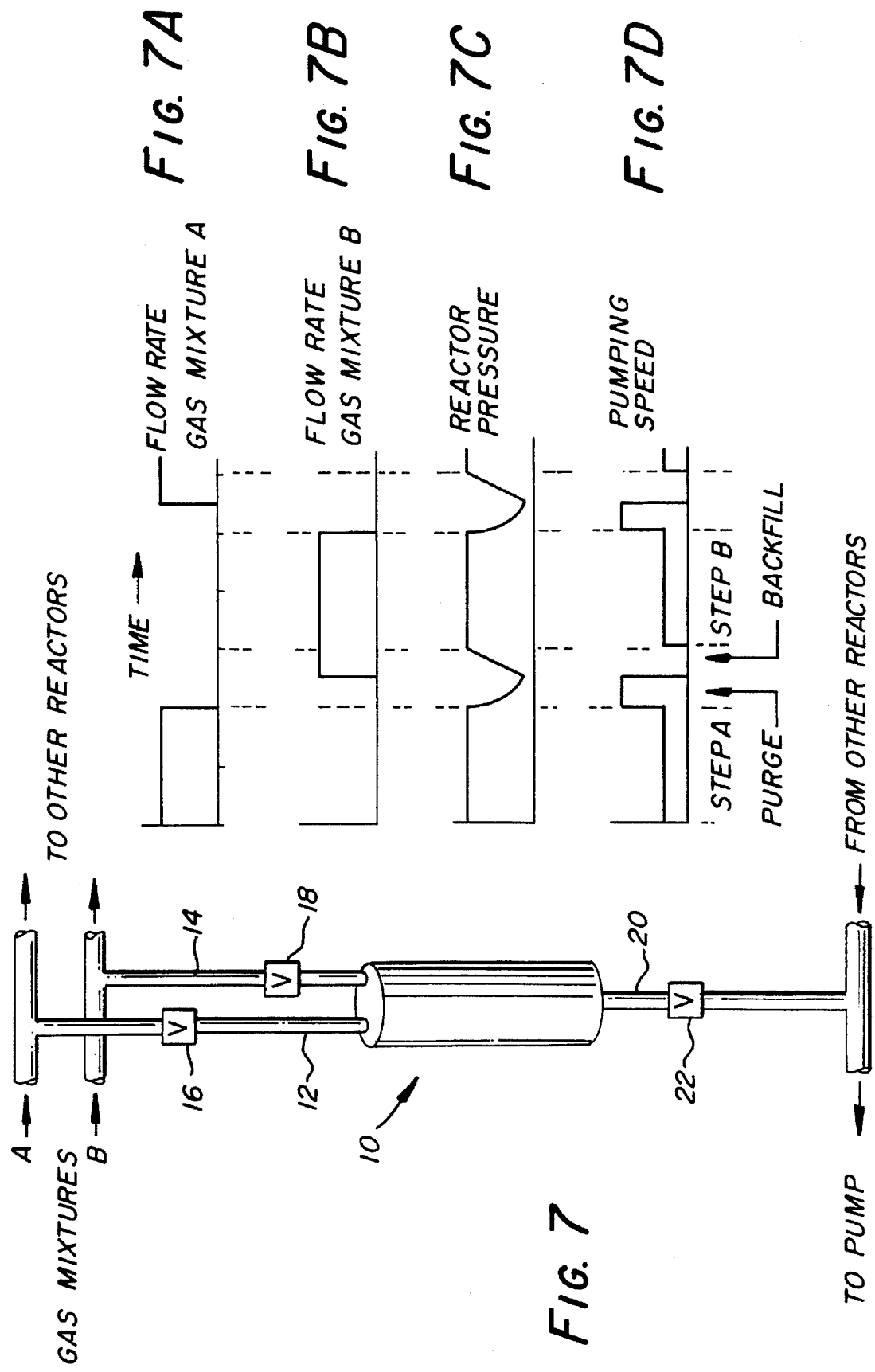

CYCLIC HOT-FILAMENT CVD OF DIAMOND

This is a divisional application of Ser. No. 07/332,914 filed on Apr. 4, 1989 now U.S. Pat. No. 5,261,959, which is a continuation of Ser. No. 07/198,966 filed on May 26, 1988 abandoned.

This invention relates to an improved method for producing diamond crystals, and more particularly to a chemical vapor deposition for producing diamond crystals from a hydrogen-hydrocarbon gas mixture brought into contact with a heated substrate, in which the operating process parameters or conditions are varied in a cyclical manner alternating between conditions which favor diamond crystal nucleation and growth and conditions which favor gasification of codeposited graphite.

BACKGROUND OF THE INVENTION

Reference is made to application Ser. No. 06/944,729—Anthony et al, filed Dec. 22, 1986, now abandoned assigned to the same assignee as the present invention, which discloses an improved method and apparatus by which diamond crystals are caused to nucleate and grow on a preferred substrate by means of a heated filament and luminescent gas plasma activated hydrogen-hydrocarbon gas mixture coming into contact with the substrate. The copending application discloses that a hydrogen-hydrocarbon gas mixture subjected to concurrent activation by an incandescent tungsten wire electrical resistance heater and by electromagnetic microwave energy becomes a luminescent gas plasma with a significant atomic hydrogen content. The activated gas mixture is brought into contact with a heated substrate, and as a consequence thereof, diamond crystals are formed or nucleated on the substrate from the gas mixture with subsequent diamond crystal growth. The noted process is referred to as a chemical vapor deposition, CVD, process. From the copending application, it is also known that diamonds may be obtained from the described CVD process without the use of microwave energy, as shown in U.S. Pat. No. 4,434,188 which described a CVD process of causing diamond nucleation and growth from a heated gas mixture in contact with a substrate.

In general, the chemical vapor deposition CVD process involves selection of operating parameters such as selection of a precursor gas and diluent gases, the mixture proportions of the gases, gas temperature and pressure, the substrate temperature and means of gas activation. When these parameters are adjusted to provide diamond nucleation and growth on a substrate, there is, as an unavoidable consequence of the process, codeposition of graphite on the substrate along with the diamond. When the parameters are adjusted to provide for removal of the graphite by gasification or minimal deposition or graphite, diamond nucleation and growth significantly decrease. The known CVD processes for producing diamond crystals can be described as continuous processes which attempt to establish those conditions of pressure, temperature, and gas mixture which provide an acceptable rate of diamond crystal nucleation and growth, and only minimal graphite codeposition.

In order to grow diamond crystals at a reasonably high rate in the CVD process as described, the operating parameters are usually set as a compromise between deposition of graphite and diamond crystal growth, or between diamond growth and graphite removal. Ordinarily, such a compromise may be acceptable where the operating parameters can be set to establish conditions under which graphite codeposition is restrained and some diamond crystal growth continues, but means are needed to achieve graphite removal in a shorter time period, e.g., providing maximum short term clean up without overall reduction of high rate diamond growth.

OBJECTS OF THE INVENTION

It is an object of this invention to provide sequential application of diamond growth and graphite gasification conditions in a CVD process for producing diamond crystals.

Another object of this invention is to provide an improved CVD process for producing diamond crystals under conditions which favor high growth rate followed by optimal removal of codeposited graphite.

It is yet another object of this invention to provide an improved CVD process for producing diamond crystals in which those operating parameters which favor graphite clean up and those parameters which favor diamond crystal growth, are applied in a sequential manner within the CVD process so that more of the process time can be allocated to diamond crystal growth.

SUMMARY OF THE INVENTION

Diamond crystals are produced in a CVD process by subjecting a hydrogen/hydrocarbon gas mixture to activation by an incandescent tungsten filament wire heater while exposing or contacting a substrate surface with the activated mixture for diamond crystal nucleation and growth. The operating conditions of certain condition-controlled steps or phases of the process such as a high diamond growth rate step and a graphite gasification step are applied in a cyclic or sequential manner to alternately favor the high growth rate and thereafter gasification.

It will be understood from this disclosure that gasification refers to removal of co-deposited graphite or carbon from the diamond deposit without substantial loss of diamond.

According to the present invention, diamond is produced by thermal decomposition of a hydrocarbon-hydrogen gas mixture at low pressure in a chemical vapor deposition apparatus. The overall process which, for convenience, can be described as a cyclic process comprises a diamond growth phase or step which is carried out under conditions which promote nucleation and growth of diamond crystals and a second phase or step which can be described as a purification phase during which co-deposited graphite is gasified and removed from the diamond material. This second phase is carried out under conditions which favor removal of graphite.

In general, deposition or growth conditions comprise a hydrocarbon-hydrogen gas mixture in which the amount of hydrocarbon gas, the carbon source, is maintained at a level which is sufficient to provide maximum growth. During this phase of the cycle, the substrate is heated by a resistance-heated filament to a temperature sufficient to sustain diamond growth. The filament temperature is preferably between about 2000° C. and 2500° C. The substrate temperature is at least, in part, dependent on the filament temperature and the thermal stability of the substrate material. In general, substrate temperatures in the range of about 900° C. to about 100° C. are preferred, particularly for a molybdenum substrate.

The actual amount of hydrocarbon in the gas mixture can be varied to provide sufficient carbon atoms for conversion to diamond. Suitable hydrocarbons include methane, acetylene, ethane, lower aliphatic alcohols, and the like. For methane, a preferred mixture for the growth phase comprises from about 2 to about 25 Volume percent hydrocarbon, the balance being hydrogen. A particularly preferred mixture comprises about 18 volume percent methane. For other hydrocarbons, the amount of hydrocarbon can be adjusted to provide equivalent atom percent carbon.

While about 2 volume percent hydrocarbon is the upper limit of the continuous process presently practiced, the present process is amenable to a hydrocarbon-rich deposition phase gas mixture. The term hydrocarbon-rich is intended to include gas mixture compositions having substantially more than about 2 volume percent hydrocarbon. For example, gas mixtures comprising from about 10 to about 25 volume percent, the balance hydrogen, and perhaps one or more inert gases, are within the term "hydrocarbon-rich".

During the second phase, removal of co-deposited graphite is promoted by exposure to an environment comprising hydrogen, a substantial proportion being atomic hydrogen and essentially no hydrocarbon, i.e., by providing an essentially pure hydrogen flow to the filament-substrate region of the chemical vapor deposition apparatus.

It will be appreciated that the cyclic process method of this invention can be carried on by at least two techniques, which for convenience, are referred to as physical modulation and temporal modulation.

The physical modulation embodiment involves physical movement of the substrate through zones or regions in which the existing conditions are sequentially growth phase or gasification phase. The conditions in each zone remain constant while the substrate shuttles or passes from one to the other.

In the temporal modulation embodiment, the substrate is maintained in a stationary position and the conditions, particularly the gas mixture composition, are varied in order to change the conditions to which the substrate is exposed, thus subjecting the substrate to alternating growth phase and gasification phase conditions.

In both embodiments, the relative exposure to growth phase conditions and gasification phase conditions are measured by time, each being balanced so that the gasification phase exposure is sufficient to substantially remove the co-deposited graphite from the growth phase.

In the one embodiment, the entire substrate is contained in a single reaction chamber while conditions favoring high rate growth followed by graphite gasification are varied or modulated in sequence or time. In the other embodiment, the substrate which can be circular in design or carried on a circular stage rotates through adjacent chambers of the reactor in which constant conditions are set and maintained, one favoring high growth rate and the other gasification of graphite. The size of each chamber can be designed to cooperate with speed of rotation thereby allowing maximum growth time and minimum, though sufficient, gasification time.

It will be appreciated that the objects of this invention are achieved by a process which provides maximum residence time in a high diamond growth rate environment, e.g., high hydrocarbon gas concentration, thus avoiding the shortcomings of the prior art continuous process with respect to the requirement that the rates of graphite deposition and gasification balance; that balance being achieved at the expense of the diamond growth rate, e.g., by using a low-hydrocarbon or hydrocarbon-starved environment.

The embodiments of the invention will be more fully understood when considered in view of the drawings.

BRIEF DESCRIPTION OF THE DRAWINGS

FIG. 1 is a schematic illustration of a rotary apparatus which embodies the invention and in which the cyclical concept of this invention may be practiced.

FIG. 2 is a schematic cross-sectional view of the apparatus of FIG. 1 taken along the line 2—2 thereof.

FIG. 3 is a schematic top view of the apparatus of FIG. 1.

FIG. 4 is a schematic illustration of a modification of the apparatus of FIG. 1.

FIG. 5 is a schematic cross-section of the apparatus of FIG. 4, taken along line 5—5.

FIG. 6 is a schematic plan view of the apparatus of FIG. 5.

FIG. 7 is a schematic representation of time modulated CVD reaction apparatus with associated schematic representation of the flow rate, reactor pressure, and pumping speeds at the indicated points in the process.

DESCRIPTION OF A PREFERRED EMBODIMENT OF THE INVENTION

An effective apparatus for the practice of the invention is shown in FIG. 1. This apparatus is effective to establish and maintain, simultaneously, the two most important cycle conditions of a CVD process of producing diamond crystals, i.e., diamond growth and graphite gasification conditions. Such conditions can be separately but concurrently applied to the substrate on which diamonds are being produced so that essentially no process time is lost in effecting parameter adjustments required to change from one set of conditions to another.

Referring now to FIG. 1, a rotary apparatus 10 is disclosed in which the practice of this invention may be expeditiously carried out. Apparatus 10 comprises hollow quartz cylindrical reaction chamber 11 closed off at opposite ends by stainless steel plates 12 and 13. Plate 12 is described as a gas inlet plate and plate 13 is described as a base plate. Plates 12 and 13 are sealed to chamber 11 by a suitable material such as a silicone rubber. Projecting through plate 12 and suspended in electrical insulating relationship therefrom by insulators 2, are four molybdenum rods, 14, 15, 16 and 17 (16 and 17 not shown) arranged in a rectangular configuration with their free ends spaced from plate 13. Each rod includes a small transverse aperture 18 therethrough adjacent the free end. Each rod also has the combination of a set screw 19 and a threaded axial aperture therein at its free end. Suspended from plate 12 is a rectangular quartz partition member 20 which is positioned centrally or diametrically in and, supported by cylinder 11, between a pair of molybdenum rods 14 and 15.

Partition member 20 includes a free end 21 which is also spaced from plate 13 in the same manner as rods 14–17 have their free ends spaced from plate 13. The spacing of rods 14–17 and partition 21 from plate 13 provides an uninterrupted cylindrical space 22 at one end of chamber 11. A drive shaft 23 projects through base plate 13 into cylindrical space 22 and is adapted for rotation in base plate 13 in an appropriate mechanical feed through 24 having minimal gas leakage characteristics. Concentrically mounted on shaft 23 for rotation therewith in cylindrical space 22, is a circular turntable disc 26 positioned in close proximity to the free ends of rods 14–17 and free end 21 of partition 20. Shaft 23 is conveniently rotated by means of a small electrical motor, not shown, e.g., below the base plate. Diametrical partition member 20 engages cylinder 11 along a diameter thereof and effectively divides chamber 11 into separate cells 27 and 28. The gas admixture is introduced into cell 27 by means of aperture 29 in gas inlet plate 12 and is exhausted therefrom by means of aperture 30 in base plate 13. Similarly chamber 28 includes a gas inlet aperture 31 in gas inlet plate 12 and a gas outlet 32 in base plate 13.

In a general practice of this invention, a predetermined gas or gas mixture is introduced into cells 27 and 28 through gas inlets 29 and 31 to flow axially through chamber 11 and exit through gas exits 30 and 32 in base plate 13 to provide a slowing gas stream in cells 27 and 28. The flowing gas is caused to come into contact with incandescent electrical resistance tungsten wire heaters 33 and 34 which are more clearly illustrated in FIG. 2. Referring now to FIG. 2, electrical resistance tungsten wire filament heaters 33 and 34 are shown as suspended between molybdenum rods 14 and 16 in chamber 28, and 15 and 17, in cell 27.

The gas flow in each cell 27 and 28 comes into contact with heaters 33 and 34 and impinge a substrate which is best described with respect to FIG. 1.

In FIG. 1, a substrate in the form of a thin disc 35, preferably of refractory metal such as molybdenum, is attached to turntable 26 by screws 36 to rotate with turntable 26. The arrangement of the noted electrical resistance heaters 33 and 34 with disc 35 and rods 14–17 are best described with respect to FIG. 2.

Referring again to FIG. 2 which is view of FIG. 1 taken along the line 2—2 thereof, the four rods 14–17 are illustrated as positioned one at each corner of a rectangle with a heater coil 33 suspended between adjacent closer spaced rods 14 and 16, and 15 and 17 by means of the noted set screws 19 (FIG. 1). Each tungsten wire heater is in the form of an extended fine wire helical coil with straight wire end sections which are inserted in an aperture 18 (FIG. 1) of each of a pair of rods and retained therein by set screws 19 (FIG. 1) which progress transversely into apertures 18 to engage the wire end therein.

The apparatus of this invention provides means to separately establish and maintain, in a CVD diamond process, diamond growth, D, conditions and graphite gasification or clean up, G, conditions, both as constant and steady state processes, while permitting sequential or cyclical application of these conditions to diamond production. Referring again to FIG. 1, by utilizing the same gas pressure in each cell 27 and 28, there is little, if any, flow of gas from one cell to the other under the free end 21 of partition 20.

In a practice of this invention, optimum diamond nucleation and growth conditions, D, are established in one cell, for example cell 27, and optimum graphite clean up conditions, G, are established in the other cell 28. The following parameters are relevant for establishing D and G conditions:

1. Kind of gas or gases utilized.
2. The use of a mixture of gases.
3. Proportions of the gas mixture.
4. Gas flow rate, pressure and temperature.
5. Substrate temperature.

For D conditions, the gas is usually a mixture of high purity hydrogen (above about 99.0%) and hydrocarbon gases, and for G conditions, high purity hydrogen is the main or sole gas. Substrate temperature is the result of impingement of hot gases thereon and radiation from the heater coils, both of which are relevant to substrate temperature. The gas in cells 27 or 28 is heated by coming into contact with heaters 33 and 34 which are at their incandescent temperature, about 2000 degrees C., and positioned close to substrate 35. In some instances, it may be desirable to use an inert gas such as helium as a diluent for the hydrocarbon gas, i.e., a helium-hydrocarbon mixture in place of a hydrogen-hydrocarbon mixture. Addition of helium gas reduces the amount of atomic hydrogen formed under diamond growth conditions. Substrate material is advantageously a refractory metal such as molybdenum. Turntable 26 is caused to rotate, for example, about 2.0 RPM. Under these conditions, substrate 35 is sequentially exposed to each set of conditions D and G in cells 27 and 28 but only for a time period which, in conjunction with precise parameter adjustments will optimize the desired crystal growth rate effects, i.e., maximum rate of diamond growth in one chamber and maximum rate of graphite gasification in the other chamber. Rotation of turntable 26 represents relative motion between the defined chambers 27 and 28 and substrate 35 on turntable 26.

It will be apparent that the described apparatus can be modified so as to carry out the method or process of the invention in devices of different construction. For example, the apparatus of FIG. 1 may be modified so that the shaft and turntable are stationary and the other parts rotate. Alternatively, a substrate in the form of a linear surface such as a conveyor belt may pass under an extended linear array of cells to provide the cyclical D and G concept of this invention.

A practice of this invention was carried on as follows utilizing the apparatus of FIG. 1. Gas exit apertures 30 and 32 were connected by a common conduit to a vacuum pump which reduced the pressure in reaction chamber 11 to about 1.0 torr. From an appropriate supply of gases, hydrogen gas was caused to flow into cell 27 at the rate of 36 cm$^3$/min. and into cell 28 at 44 cm$^3$/min. and methane was introduced in cell 27 at 8.0 cm$^3$/min., bringing the pressure to about 10 torr. From an appropriate source of electrical power, a current of 26 amperes was caused to flow in each heater 33 and 34.

The results of two runs are set forth in Table 1, identified as Runs 30 and 57. Run 10 was a single chamber continuous run of the type described in copending application 944,729.

TABLE 1

| | Experimental Conditions | | |
|---|---|---|---|
| Run | 30 | 57 | 10 |
| Process | Cyclic | Cyclic | Continuous |
| Substrate Rotation Rate (rpm) | 2 | 2 | 0 |
| Heat Treated Substrate | No | Yes | No |
| Filaments Supported Their at Midpoints | No | Yes | No |
| Filaments Heights (cm) | 0.3–1.0 | 0.3 | 0.7–1.0 |
| Filament Currents (amps) | 26 | 26 | 26 |
| H$_2$ Flow Rate (chamber 28) | 44 | 44 | 40 |
| CH$_4$ Flow Rate (chamber 28) | 0 | 0 | 4 |
| H$_2$ Flow Rate (chamber 27) | 36 | 36 | 40 |
| CH$_4$ Flow Rate (chamber 27) | 8 | 8 | 4 |

*flow rates are in standard cm$^3$/min filament heights are measured from lowest point of coil (ranges reflect height changes during run)

In the practice of the herein described CVD diamond process, some competition occurs at the substrate for the carbon in the gas mixture. It has been found that a significant amount of carbon diffuses into the substrate material and therefore is not available for the diamond nucleation and growth. Carbon diffusion and diamond production processes are considered competing processes. One method for minimizing carbon diffusion involves pretreatment of the substrate, e.g., by heating to an elevated temperature in the range of about 900° C. to about 1200° C. in a hydrocarbon gas environment such as natural gas or methane to saturate the substrate with carbon prior to its use in the CVD process.

Heater coils 33 and 34 as illustrated in FIGS. 2, 3, and 4, are wound from 218 tungsten wire of 0.020 in. D. in a helical coil form with an I.D. of 0.1875 in. and a length of 1.0 in. and straight sections of 0.5 in. at each end of the coil which fit into apertures 18 as described with respect to FIGS. 1–4. During the deposition process electrical power input to heaters 33 and 34 raises the temperature causing the heaters to become incandescent. The gas in cells 27 and 28 comes into contact with and is rapidly heated before impinging on substrate 35. The temperature of heaters 33 and 34 is about 2000° C. and substrate 35 temperature is above about 800° C. Accordingly, the gas temperature between a heater element and substrate 35 is in the range of from above about 800° C. to a temperature approaching 2000° C. In the cyclic process as described, graphite gasification proceeds in one chamber such as cell 28 in a pure hydrogen atmosphere, and diamond growth occurs in the other cell 27 in a hydrogen-hydrocarbon gas mixture. Diamond growth occurs in cell 27 only during the fraction F, of the cycle period that any point on the substrate 35 spends in the growth cell 27 generally under heater 33. In this connection, a distinction is made between an intrinsic rate, I, based on the cumulative residence time under the growth filament and an effective growth rate, E, based on the full process period. The relationship between these growth rates is given by the equation $E = F \times I$.

TABLE 2

| Run | | Experimental Results | | |
|---|---|---|---|---|
| | | 30 | 57 | 10 |
| Process | | Cyclic | Cyclic | Continuous |
| Diameter of Largest Hemispheres (microns) | D | 43 | 56 | 80 |
| Process Period (hours) | T | 6.0 | 5.4 | 7.2 |
| Fraction of Cycle Period Allocated to Diamond Growth | F | 1/6 | 1/6 | 1 |
| Applied Process Time | A | T/3 | T/3 | T |
| Intrinsic Growth Rate (microns/hr) | I (= D/FT)q | 43.0 | 62.0 | 11.1 |
| Effective Growth Rate (microns/hr) Based on Full Process Period | E (= D/T) | 7.2 | 10.4 | 11.1 |
| Effective Growth Rate (microns/hr) Based on Applied Process Time | E' (= D/A) | 21.5 | 31.0 | 11.1 |

Table 2 above, shows the improvement in the intrinsic growth rate I of diamond crystals obtained by the cyclic practice of this invention as compared to the prior art continuous process. Similarly the effective growth rate E' is much greater for the cyclic practice. The value given for the effective growth rate E needs some qualification. As described above with respect to the FIG. 1 embodiment, diamond growth takes place in a 60 degree segment of the cyclic or one revolution of substrate 35 (F=1/6). Graphite evaporation takes place in a further 60 degree segment. Also as described above, these segmented conditions result in two-thirds of each cycle representing unapplied cycle time. When unapplied time is considered in E its value becomes comparable with the value for the continuous process. In Table 2 the fraction of cycle period F allocated to diamond growth is described with respect to FIG. 2 as follows.

Referring now to FIG. 2, the subtended angle defined by the length of the heaters 33 and 34 is 60 degrees. This indicates that a point or small region on the substrate adjacent one end of a heater moves through an arc of 60 degrees while being directly exposed to the effects of a heater combined with a prescribed gas flow. 60 degrees represents 1/6 of one revolution of the substrate and accordingly F=1/6. It has been found that diamonds are found on substrate 35 (FIGS. 1 and 2) along an annular band thereon which is related to the shape of heaters 33 and 34. The width of the annulus is usually two to three times the diameter of a heater coil. In the continuous process where the substrate is stationary, diamonds are found in two localized oblong regions, one under each filament.

One of the important advantages of the cyclic process is the virtual elimination of transition time between the deposition and gasification conditions so that no diamond growth time is lost changing conditions or by prolonged graphite clean up. This invention provides separate and isolated optimum constant state conditions for diamond deposition and graphite gasification in one apparatus with minimal transition time from one condition to the other. Each cell 27 and 28 represents a flowing gas stream under conditions which enhance diamond growth or graphite removal as specified. The gas streams impinge on, or are deflected by, the substrate so that the one stream provides diamond crystal nucleation and growth on the substrate, and the other stream removes codeposited graphite. A modification of the FIG.. 1 apparatus which also provides the separate and isolated conditions is illustrated in FIG.4.

Referring now to FIG. 4, which is a side elevation view, apparatus 37 comprises a hollow cylindrical reaction chamber 38 sealed at both ends with plates 39 and 40. Within hollow chamber 38 and in the same manner as illustrated in FIG. 1, four molybdenum rods 41–44 are suspended from plate 39 in spaced relationship to each other within reaction chamber 38. An electrical resistance heater 45 is suspended between rods 42 and 43 in the same manner as heaters 33 and 34 were suspended from similar rods in the FIG. 1 apparatus. Surrounding rods 42 and 43 and heater 45 is another but smaller diameter open ended quartz tube 46. Tube 46 is positioned axially but eccentrically in cylinder 38 with one of its open ends coplanar with an open end of cylinder 38, both of which are sealed to plate 39. The other open end quartz tube 46 is spaced within a few millimeters from substrate 35 on a turntable 47 which are similar in construction and operation to substrate 35 and turntable 26 of FIG. 1. A gas inlet aperture 48 in plate 39 communicates with tube 46 while other gas inlet apertures 49 communicate with the interior volume of cylinder 38 not occupied by tube 46. Accordingly, tube 46 with its own heater 45, and its own gas inlet aperture 48, defines a separate and isolated cell 51 within cylinder 38 in which deposition (D) or gasification (G) conditions are established. Also a D or G set of conditions may be established in the surrounding cell or volume 52 of cylinder 38 not occupied by tube 46. This relationship is more clearly shown in FIG. 5 which is a view of FIG. 4 taken along the line 5—5 thereof.

Referring now to FIG. 5, apparatus 37 includes the noted hollow quartz cylinder 38 with the smaller diameter quartz tube 46 positioned axially but eccentrically therein in surrounding relationship to a pair of rods 42 and 43 which suspend a heater coil 45 therebetween. As previously described, rods 41, 42, 43 and 44 are arranged along an arcuate path spaced within the parallel to quartz cylinder 38. As illustrated, the arc of heater 45 only occupies a part of the projected circumference of which it is a part. The remaining rods 41 and 44 also support an arcuate heater coil 53 which, together with heater coil 45 defines a circular length of heater coil, the circumference of which is concentric with and spaced within cylinder 38. The molybdenum rods which support each heater 45 and 53 are connected to a source of electrical power (not shown) through separate control means so that electrical power to the heaters may be separately controlled. As illustrated in FIG. 5, the subtended angle of tube 46 is 60 degrees so that a point on the substrate 35 under heater 45 moving under tube 46 spends one-sixth of the time required for turntable 35 to make one revolution. High efficiency graphite removal or clean up conditions may be established in tube 46 while in the remaining volume, deposition conditions are established and maintained. Under these circumstances, F is about 5/6, as compared to 1/6 for the apparatus of FIGS. 1 and 2.

In FIG. 2, note that only 60 degrees, 1/6 of a revolution of substrate 35, is allocated to diamond growth in chamber 28, and only 1/6 or 60 degrees of rotation of substrate 35 is allocated to graphite gasification conditions (G) in chamber 27, i.e., a point on substrate 35 adjacent heater 34 moves through the subtended angle of 60 degrees. Accordingly, from one full cycle (360 degrees of revolution of substrate 35, only 1/3 revolution) is actually applied to D or G and the remaining 2/3 of the cycle is unapplied cycle time.

The embodiment of FIGS. 4 and 5 increases the applied cycle time and substantially eliminates unapplied time. For example, referring to FIG. 5, G conditions are established in tube 46 representing 60 degrees or 1/6 of a revolution of substrate 35. However, D conditions are established in space 52 representing the balance or 5/6 of a revolution of substrate 35, and accordingly almost a full cycle is utilized as applied time, about 1/6 in tube 46 under heater 45 and about 5/6 in space 52 under heater 53. Tube 46 may be utilized for concentrated graphite removal and space 52 for diamond growth.

In the apparatus as described in FIGS. 1–6, the substrate is cyclically and alternately, and serially and sequentially exposed to two steady state conditions D and G each of which may have its parameters adjusted for optimum constant condition results for the time period the substrate spends exposed to the conditions in each chamber. Both the D and the G processes are low pressure processes so that, with constant and equal pressure within tube 46 and within cylinder 38 (FIGS. 3 and 4), gas leakage between tube 46 and cylinder 38 is minimized. The cyclic CVD process is more adaptable to higher concentration of hydrocarbon than the constant or steady state process. For example, Table 1 shows that for the same total flow rate, the methane flow rate in the cyclic process was 8 cm³/min. compared to 4 cm³/min. for the continuous process. This invention provides a CVD diamond process apparatus utilizing a method which applies steady state diamond growth (D) conditions, and graphite clean up (G) conditions cyclically or alternatively to a diamond crystal during its growth process.

In the apparatus as described in FIG. 1, the ends of each cell 27 and 28 represented by the substrate 35 may be described as coplanar in that the planar substrate surface 35 serves as an assumed end surface for each cell to be impinged by the gas stream emanating from each cell 27 and 28.

In the FIG. 4 apparatus, in the same manner as described above for FIG. 1, substrate 35 serves as a coplanar base to both cells 51 and 52 to be impinged by the separate gas streams in each cell. In each apparatus of FIGS. 1–6, substrate 35 is a planar surface positioned transversely to the open ends of the gas cells. Substrate 35 also moves in a transverse direction so that a surface region thereon is exposed to the gas flow of each cell. The procedure is continuously repetitive without any time lost in stopping or any requirement for reversal. The process occurring in each chamber continues as a constant process but the process is applied cyclically to the carousel-like substrate as each previously impinged surface region or point on the substrate moves into position to be exposed to the appropriate gas stream.

FIG. 7 shows a chemical vapor deposition reactor 10 having gas inlet conduits 12 and 14, fitted with automatic open-closed valves 16 and 18. On the vacuum side of the reactor, conduit 20 is provided with a variable flow valve 22.

For the purposes of description, gas mixture A can be a hydrogen-methane mixture and mixture B can be high purity hydrogen.

Conditions within the system at various points are illustrated by the time-function data for a complete cycle of the process. For example, when gas mixture A flows through open valve 16, valve 18 is closed. Step A for purposes of description therefore corresponds to a deposition phase. At the end of the deposition phase, valve 16 is closed, valve 22 is opened completely to purge the reactor. When reactor pressure is reduced to a predetermined level, valve 22 closes and valve 18 opens, refilling the reactor with hydrogen for completion of the cycle by the gasification phase (Step B). While the time factor for flow of gas mixtures A and B are shown as being equal, it will be appreciated that the time factor can be adjusted to provide maximum efficiency for the deposition and gasification phases.

Optional connection to other similar reactors is within the scope of the description.

The method and apparatus of this invention are advantageously utilized in a modified diamond CVD process which is specifically directed to the rapid growth individual diamond crystals. In the practice of this invention as described, as well as in the practice of the invention in the noted copending application, diamond crystal nucleation is evidenced by the rapid appearance of a profuse number of diamond crystal nucleation sites. Observation of diamond crystal nucleation and growth on a substrate suggests two mechanisms for crystal growth. In the first mechanism, carbon atoms from the impinging gas stream contribute directly to crystal growth at these sites. In another mechanism, other carbon atoms in great numbers impinge on intermediate areas of the substrate and migrate along the substrate surface to the nucleation sites to contribute to diamond crystal growth. When there are a great number of nucleation sites, there is competition among adjacent sites for these carbon atoms and some sites may receive carbon atoms at the expense of an adjacent site, i.e., carbon atoms which otherwise would have migrated to an adjacent site. Accordingly, a few number of sites may be beneficial as each site may receive a full supply of carbon atoms without excess loss to adjacent competing sites.

Attempts have been made to limit or predetermine the number of diamond crystal nucleation sites by roughening the substrate surface in a predetermined manner, for example, by having a prescribed geometric array of spaced peaks and valleys to encourage nucleation on the peaks, for example. Also, it is known that certain substrate metals to are more conducive to diamond crystal nucleation than others. Refractory metals, molybdenum, for example, are more conducive than other metals such as steel, for example. Furthermore, the operating parameters of the CVD process may be adjusted to suppress or limit profuse nucleation. Generally, enrichment of the hydrogen-hydrocarbon gas mixture with methane gas leads to increased nucleation. The method and apparatus of the present invention may be advantageously applied to limit nucleation and therefore concentrate the CVD process on fewer nucleation sites for more favorable crystal growth because the substrate is continuously alternately exposed to optimum diamond growth and graphite evaporation conditions for concentration of these optimum conditions on crystal growth and graphite evaporation at each site. Fewer nucleation sites provides each site with a more generous share of one of the growth mechanisms as described.

In the cyclic process for producing diamond by chemical vapor deposition, the composition of the gas mixture is varied to produce a two-step cycle. In the deposition step, the mixture is rich in hydrocarbon in the sense that the partial pressure of the hydrocarbon feedstock in the gas mixture is significantly greater than in the prior art continuous process. For the gasification step, the gas is pure hydrogen, which has been found to enhance removal of graphite deposited by the hydrocarbon-rich first step. It has been shown that the increase in the instantaneous growth rate obtained by using the hydrocarbon-rich mixture more than compensates for the extra process time needed to remove the graphite by gasification, so that the effective growth rate exceeds the rate for the continuous process.

As described, the cyclic process can be achieved by two embodiments of the process. The first embodiment involves temporal variation of the gas composition. In this embodiment the substrate remains generally stationary while the gas composition is varied in phase over the entire substrate. A second embodiment, known as spatial variation involves movement of the substrate from one reaction chamber to another, each with different gas composition so that as the substrate rotates through the chambers, it is alternately exposed to different gas compositions.

The so-called temporal variant of the cyclic process is in many respects more convenient for large scale reactors, particularly when the gas composition is varied on a time scale which is shorter than the gas residence time in the reactor. FIG. 7 is a schematic representation of a single chamber reactor which can be varied with time and of the purge refill cycle. The reactor is fitted with electronically activated flow controllers and high vacuum valves. The gas composition is varied by adding to each cycle two purge steps during which the high vacuum valve is opened relatively wide. The object is to briefly depress the pressure following a growth step, so that when the reactor is back filled with the hydrocarbon-free gas mixture called for in the gasification step, there remains only a very small partial pressure of the hydrocarbon-containing mixture which was used during the deposition portion of the cycle. That partial pressure is essentially equal to the pressure prevailing at the end of the preceding purge step.

While this invention has been described with regard to preferred embodiments thereof, it will be understood by those skilled in the art that various changes and modifications may be made without departing from the invention as set forth in the following claims.

What I claim is:

1. A method for synthesizing diamond by a cyclic hot-filament chemical vapor deposition (CVD) process, comprising the steps of:

(a) providing a first flow stream of one or more gases, at least one of which is a gas containing carbon;

(b) providing a second flowing stream of gas isolated from said first stream and consisting essentially of a hydrogen;

(c) rotating a substrate to expose a region of said substrate sequentially to said first and second streams on a continuing basis for diamond nucleation and growth on said region of said substrate.

2. The method of claim 1, wherein said substrate is exposed to said first flow stream in a filament under a temperature from about 2000° C. to about 2500° C.

3. The method of claim 1, wherein said substrate is exposed to said second flowing stream in a filament under a temperature from about 2000° C. to about 2500° C.

4. The method of claim 1, wherein said first flowing stream is heated by an electrical resistance heater.

5. The method of claim 1, wherein said second flowing stream is heated by an electrical resistance heater.

6. The method of claim 1, wherein said substrate is exposed to said first flowing stream long then exposure to said second flowing stream.

7. The method of claim 1, wherein said first gas stream comprises from about 2 to about 25 volume percent, carbon-containing gas.

8. The method of claim 1, wherein said substrate is molybdenum.

* * * * *